(12) United States Patent
Shin

(10) Patent No.: US 9,748,305 B2
(45) Date of Patent: Aug. 29, 2017

(54) IMAGE SENSOR HAVING IMPROVED LIGHT UTILIZATION EFFICIENCY

(71) Applicant: SAMSUNG ELECTRONICS CO., LTD., Suwon-si (KR)

(72) Inventor: Changgyun Shin, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 38 days.

(21) Appl. No.: 14/839,040

(22) Filed: Aug. 28, 2015

(65) Prior Publication Data

US 2016/0064448 A1 Mar. 3, 2016

(30) Foreign Application Priority Data

Aug. 28, 2014 (KR) ........................ 10-2014-0113356

(51) Int. Cl.
H01L 27/146 (2006.01)

(52) U.S. Cl.
CPC .. H01L 27/14645 (2013.01); H01L 27/14607 (2013.01); H01L 27/14625 (2013.01); H01L 27/14627 (2013.01)

(58) Field of Classification Search
CPC .................................................. H01L 27/14645
USPC ........................................................ 348/340
See application file for complete search history.

(56) References Cited

U.S. PATENT DOCUMENTS

| 8,289,422 | B2 | 10/2012 | Hiramoto et al. |
| 8,384,818 | B2 | 2/2013 | Hiramoto et al. |
| 2007/0221829 | A1* | 9/2007 | Nakagawa ................ G01J 3/02 250/226 |
| 2007/0272829 | A1* | 11/2007 | Nakagawa ........ H01L 27/14621 250/208.1 |
| 2010/0157091 | A1* | 6/2010 | Honda .............. H01L 27/14645 348/223.1 |
| 2010/0188537 | A1* | 7/2010 | Hiramoto .......... H01L 27/14621 348/294 |

(Continued)

FOREIGN PATENT DOCUMENTS

| JP | 05-183140 A | 7/1993 |
| JP | 2012-028372 A | 2/2012 |

(Continued)

*Primary Examiner* — Roberto Velez
*Assistant Examiner* — Cynthia Segura
(74) *Attorney, Agent, or Firm* — Sughrue Mion, PLLC

(57) ABSTRACT

An image sensor is provided including a photo sensor layer including a plurality of photo-sensing cells; a color separation layer disposed on the photo sensor layer and including color separation elements embedded in a transparent spacer layer; and a micro lens array arranged on the color separation layer, the micro lens array including a plurality of micro lenses. The color separation layer separates light by wavelength. The micro lens array concentrates incident light onto the plurality of color separation elements. The color separation elements include: a first main splitter which transmits light of a first primary color onto first photo-sensing cells which faces the first main splitter and diffracts and/or refracts light of colors other than the first primary color onto photo-sensing cells adjacent to the first photo-sensing cell; and a plurality of first auxiliary splitters which are arranged surrounding the first main splitter.

17 Claims, 19 Drawing Sheets

(2 of 19 Drawing Sheet(s) Filed in Color)

(56) References Cited

U.S. PATENT DOCUMENTS

| | | | | |
|---|---|---|---|---|
| 2011/0037869 A1* | 2/2011 | Hiramoto | ............... | G02B 5/045 |
| | | | | 348/222.1 |
| 2011/0164156 A1* | 7/2011 | Hiramoto | .......... | H01L 27/14625 |
| | | | | 348/272 |
| 2012/0033116 A1* | 2/2012 | Kato | ................. | H01L 27/14621 |
| | | | | 348/294 |
| 2012/0182453 A1* | 7/2012 | Hiramoto | .......... | H01L 27/14621 |
| | | | | 348/272 |
| 2014/0055649 A1* | 2/2014 | Hiramoto | .......... | H01L 27/14621 |
| | | | | 348/279 |
| 2015/0041940 A1* | 2/2015 | Lee | ................... | H01L 27/14625 |
| | | | | 257/432 |
| 2015/0304582 A1* | 10/2015 | Hirota | ................... | H04N 5/378 |
| | | | | 348/49 |

FOREIGN PATENT DOCUMENTS

| | | |
|---|---|---|
| JP | 5325117 B2 | 10/2013 |
| JP | 2014-023118 A | 2/2014 |
| JP | 2014-086743 A | 5/2014 |
| WO | 2009/153937 A1 | 12/2009 |

* cited by examiner

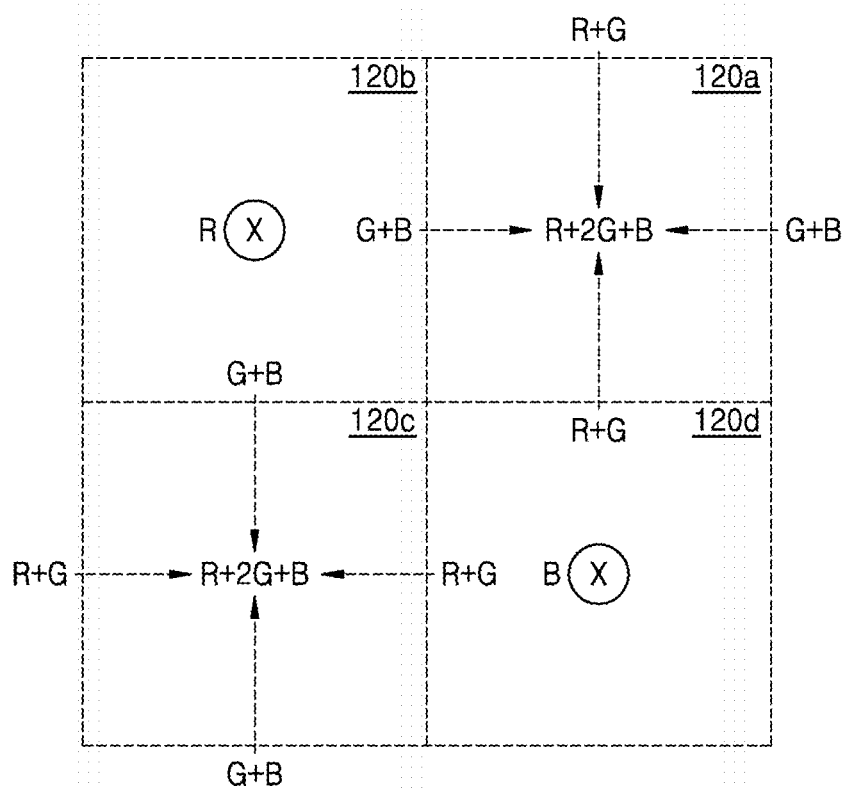

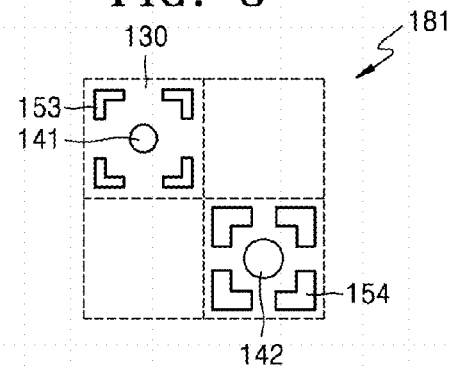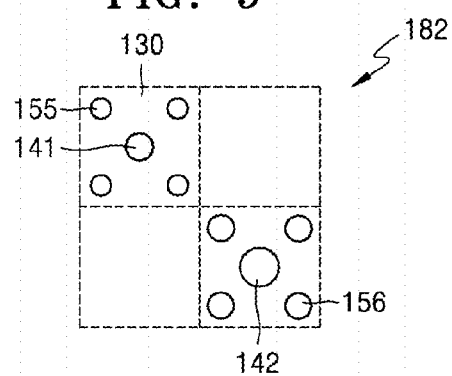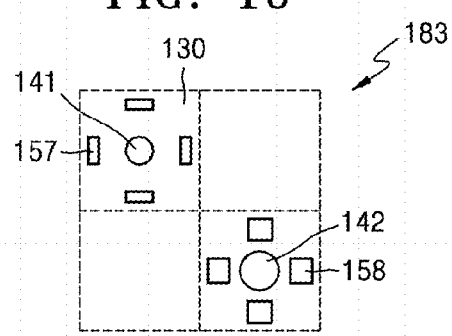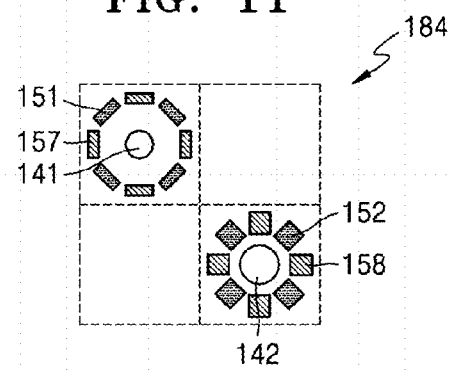

IMAGE SENSOR HAVING IMPROVED LIGHT UTILIZATION EFFICIENCY

RELATED APPLICATION

This application claims priority from Korean Patent Application No. 10-2014-0113356, filed on Aug. 28, 2014, in the Korean Intellectual Property Office, the disclosure of which is incorporated herein in its entirety by reference.

BACKGROUND

1. Field

Apparatuses consistent with exemplary embodiments relate to an image sensor having improved light utilization efficiency.

2. Description of the Related Art

Color display apparatuses and color image sensors generally use color filters in order to display color images or to detect colors in incident light. Color display apparatuses and color image sensors currently in use typically employ a red, green and blue (RGB) color filter in which two of each set of four pixels include green filters and the other two pixels include a blue filter and a red filter. Alternately, a cyan, yellow, green and magenta (CYGM) color filter may be employed in which each set of four pixels includes a cyan filter, a yellow filter, a green filter, and a magenta filter.

However, since conventional absorption-type color filters absorb light of those colors that are not transmitted, the light utilization efficiency of these filters is poor. For example, if RGB color filters are used, at most, a third of any incident light is transmitted through the RGB color filters, and at least two-thirds of the incident light is absorbed. Thus, the light utilization efficiency is, at most, about 33%. Therefore, in the case of a color display apparatus or a color image sensor, most optical losses occur in the color filters.

As the number of pixels of image sensors sensor are increased, widths of the pixels are decreased, and the amount of light reaching any one pixel is decreased. Therefore, it is increasingly important to improve the light utilization efficiency.

Recently, attempts have been made to use color separation elements to improve the light utilization efficiency of color display apparatuses and color image sensors. A color separation element separates incident light according to wavelength by transmitting or diffracting or refracting the incident light according to the wavelength thereof. In this way, light of a particular color may be transmitted to the corresponding pixel, thereby increasing efficiency and color output.

SUMMARY

One or more exemplary embodiments may provide an image sensor having improved light utilization efficiency and good light reproduction.

Additional aspects and/or advantages will be set forth in part in the description which follows and, in part, will be apparent from the description, or may be learned by practice of the presented exemplary embodiments.

According to an aspect of an exemplary embodiment, an image sensor includes: a photo sensor layer including a plurality of photo-sensing cells which generate electrical signals by detecting light and are two-dimensionally arranged; a color separation layer arranged on the photo sensor layer, the color separation layer making incident light incident on the plurality of photo-sensing cells by separating the incident light according to wavelength, and including a transparent spacer layer and color separation elements embedded in the transparent spacer layer; and a micro lens array arranged on the color separation layer, the micro lens array including a two-dimensional array of a plurality of micro lenses, which concentrate the incident light onto the color separation elements. The color separation elements include: a first main splitter which makes light of a first primary color be incident on a first photo-sensing cell which faces the first main splitter and makes mixed color light in which colors other than the first primary color are mixed be incident on photo-sensing cells adjacent to the first photo-sensing cell; and a plurality of first auxiliary splitters which are arranged surrounding the first main splitter.

The color separation elements may further include: a second main splitter which makes light of a second primary color, different from the first primary color, be incident on a second photo-sensing cell which faces the second main splitter and makes mixed color light in which colors other than the second primary color are mixed be incident on photo-sensing cells adjacent to the second photo-sensing cell; and a plurality of second auxiliary splitters which are arranged surrounding the second main splitter.

A cross-sectional area of one of the micro lenses may be twice as large as a cross-sectional area of one of the photo-sensing cells, and the plurality of micro lenses may be two-dimensionally arranged in rows and columns that are diagonal with respect to directions of rows and columns in which the plurality of photo-sensing cells are two-dimensionally arranged.

A refractive index of the color separation elements may be greater than a refractive index of the transparent spacer layer.

The plurality of photo-sensing cells may include first through fourth photo-sensing cells which respectively correspond to first to fourth quadrants defined in a Cartesian coordinate system. The first main splitter and the plurality of first auxiliary splitters may be arranged in areas facing the second photo-sensing cell, and a second main splitter and a plurality of second auxiliary splitters may be arranged in areas facing the fourth photo-sensing cell.

The first main splitter, the second main splitter, the plurality of first auxiliary splitters, and the plurality of second auxiliary splitters may be formed so that red light is incident on a second photo-sensing cell, blue light is incident on a fourth photo-sensing cell, mixed-color light in which white and green light are mixed is incident on first and third photo-sensing cells.

The plurality of first auxiliary splitters may be arranged in areas facing four edges of the second photo-sensing cell, and the plurality of second auxiliary splitters may be arranged in areas facing four edges of the fourth photo-sensing cell.

The image sensor may further include: a plurality of third auxiliary splitters which are arranged in areas facing areas adjacent to centers of the four edges of the second photo-sensing cell, and a plurality of fourth auxiliary splitters which are arranged in areas facing areas adjacent to centers of the four edges of the fourth photo-sensing cell.

The plurality of first auxiliary splitters may be arranged in areas facing areas adjacent to centers of the four edges of the second photo-sensing cell, and the plurality of second auxiliary splitters may be arranged in areas facing areas adjacent to centers of the four edges of the fourth photo-sensing cell.

The image sensor may further include a plurality of lower splitters arranged in areas disposed between a surface defined by lowermost surfaces of the first main splitter and the second main splitter and the photo sensor layer.

The plurality of lower splitters may be arranged in areas which respectively face the first photo-sensing cell and the third photo-sensing cell.

The plurality of lower splitters may be arranged in areas which respectively face the second photo-sensing cell and the fourth photo-sensing cell.

Each of the first and second main splitters may include a first main layer and a second main layer arranged on the first main layer, and a refractive index of the first main layer may be smaller than that of the second main layer but may be greater than that of the transparent spacer layer.

Each of the plurality of first and second auxiliary splitters may include a first auxiliary layer and a second auxiliary layer arranged on the first auxiliary layer, and a refractive index of the first auxiliary layer may be smaller than that of the second auxiliary layer but may be greater than that of the transparent spacer layer.

Each of the first and second main splitters may further include a third main layer arranged on the second main layer, and a refractive index of the third main layer may be smaller than that of the second main layer but may be greater than that of the transparent spacer layer.

Each of the plurality of first and second auxiliary splitters may further include a third auxiliary layer arranged on the second auxiliary layer, and a refractive index of the third auxiliary layer may be smaller than that of the second auxiliary layer but may be greater than that of the transparent spacer layer.

The plurality of first and second auxiliary splitters may be respectively formed at different heights with respect to the first and second main splitters.

According to an aspect of another exemplary embodiment, an imaging device includes: an image-capturing lens unit which forms an optical image by concentrating light reflected from an object; and an image sensor as described above which converts the optical image formed by the image-capturing lens unit into electrical signals.

BRIEF DESCRIPTION OF THE DRAWINGS

This patent or application file contains at least one drawing executed in color. Copies of this patent or patent application publication with color drawings will be provided by the Office upon request and payment of the necessary fee. The above-described and/or other aspects and advantages will become apparent and more readily appreciated from the following description of the exemplary embodiments, taken in conjunction with the accompanying drawings in which:

FIG. 4 illustrates light of different colors which is incident onto each of four photo-sensing cells which form a single unit in an image sensor;

FIGS. 8 through 11 show various examples of color separation layers which may be employed in the image sensor of FIG. 1;

DETAILED DESCRIPTION

Figure 1:
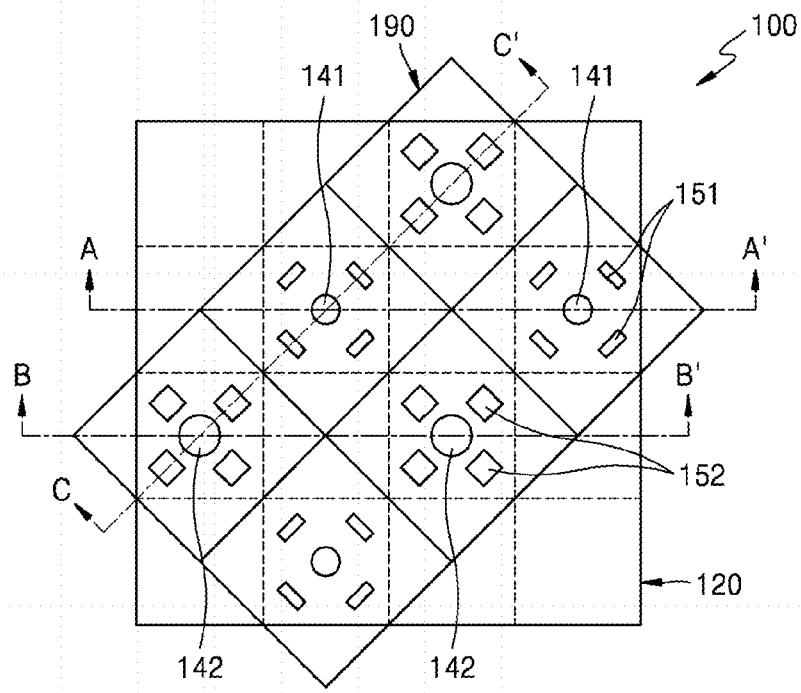
FIG. 1 is a plan view of a schematic structure of an image sensor according to an exemplary embodiment.

The attached drawings illustrate exemplary embodiments and are referred to in order to provide an understanding of the exemplary embodiments described herein, the merits thereof, and the objectives accomplished by implementation of the exemplary embodiments. The exemplary embodiments should not, however, be considered as limiting.

Hereinafter, exemplary embodiments will be described in detail with reference to the attached drawings. Like reference numerals in the drawings denote like elements, and repeated descriptions thereof will be omitted.

It will be understood that although the terms "first", "second", etc. may be used herein to describe various components, these components should not be limited by these terms. These components are only used to distinguish one component from another.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Widths of components in the drawings may be exaggerated for convenience of explanation. In other words, since widths and thicknesses of components in the drawings are arbitrarily illustrated for convenience of explanation, the following exemplary embodiments are not limited thereto.

Figure 2A:
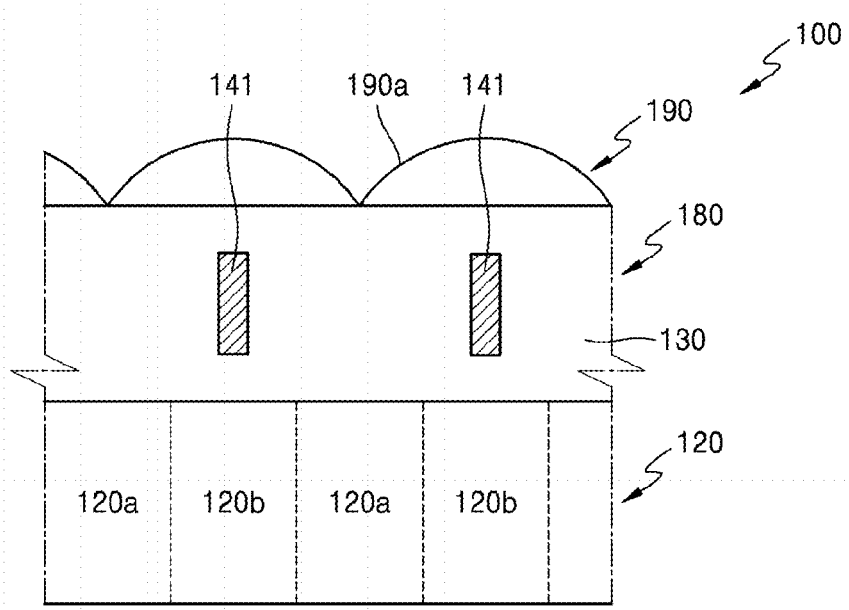
FIGS. 2A through 2C are cross-sectional views respectively taken along lines A-A', B-B', and C-C' of FIG. 1.
Figure 2B:
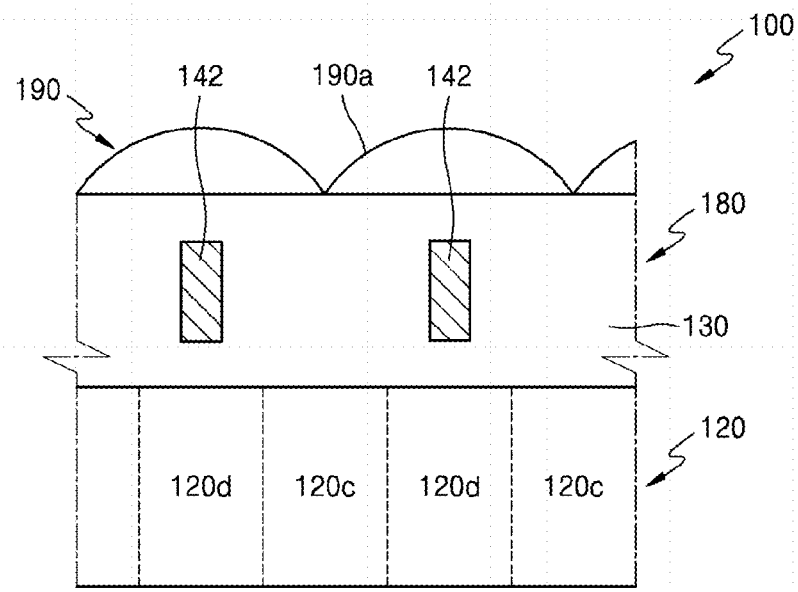
Figure 2C:
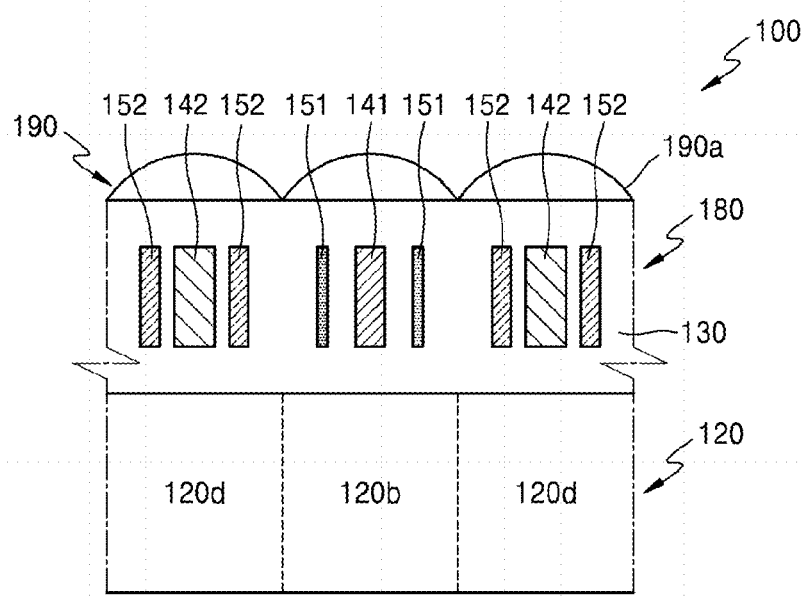
Figure 3A:
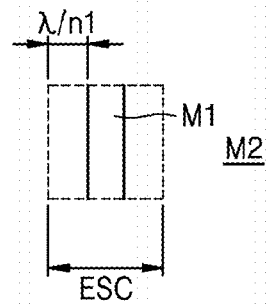
FIGS. 3A through 3C are diagrams for explaining a principle whereby color separation occurs in a color separation layer employed by an image sensor, and respectively illustrate an effective scattering cross-section (ESC), an effective refractive index, and an optical path via which color separation occurs.
Figure 3B:
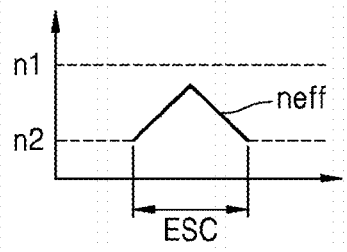
Figure 3C:
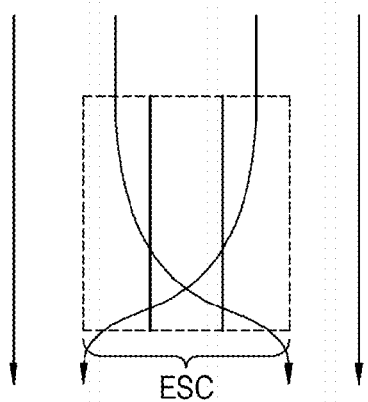

FIG. 1 is a plan view of a schematic structure of an image sensor 100 according to an exemplary embodiment, and FIGS. 2A through 2C are cross-sectional views respectively taken along lines A-A', B-B', and C-C' of FIG. 1. FIGS. 3A through 3C are diagrams for explaining a principle whereby color separation occurs in a color separation layer 180 employed by the image sensor 100 and respectively illustrate an effective scattering cross-section (ESC), an effective refractive index, and an optical path via which color separation occurs, and FIG. 4 illustrates light of different colors which is incident to each of four photo-sensing cells which form a single unit in the image sensor 100.

Referring to FIGS. 1 through 2C, the image sensor 100 includes: a photo sensor layer 120 on which photo-sensing cells 120a, 120b, 120c and 120d, which generate electrical signals by detecting light, are two-dimensionally arranged; a color separation layer 180 which is arranged on the photo sensor layer 120 and includes color separation elements which separate incident light according to wavelength; and a micro lens array 190 which is arranged on the color separation layer 180 and includes an array of micro lenses 190a, for concentrating incident light onto the color separation elements The color separation layer 180 includes a transparent spacer layer 130 and color separation elements embedded in the transparent spacer layer 130. The color separation elements include first main splitters 141, which separate incident light into light having a first color and mixed-color light including all light other than light of the first color, and first auxiliary splitters 151 which are disposed around the first main splitters 141, as shown in FIG. 1. The color separation elements may further include second main splitters 142, which separate incident light into light having a second color and mixed-color light including all light other than light of the second color are mixed, and second auxiliary splitters 152 which are disposed around the second main splitters 142, as shown in FIG. 1. The second color may be different from the first color, the first color may be red, and the second color may be blue. However, the first and second colors are not limited thereto.

The color separation layer 180 separates the incident light according to wavelength based on differences between the refractive index of the transparent spacer layer 130 and refractive indices of the splitters 141, 142, 151, and 152 embedded in the transparent spacer layer 130.

Referring to FIG. 3A, a first element M1 comprising a first material and having a dimension similar to a wavelength of incident light is arranged in a second element M2 of a second material, and an effective scattering cross-section (ESC) is formed around the first element. The first element M1 may be any one of the first main splitters 141, the second main splitters 142, the first auxiliary splitters 151, and the second auxiliary splitters 152, and the second element M2 may be the transparent spacer layer 130.

In a structure having a dimension similar to a wavelength of incident light, an optical boundary between materials is not clearly defined with respect to the incident light. Thus, around the structure, an area indicating a predetermined change of a refractive index, which is determined by a size of the structure and differences between refractive indices of the structure and a neighboring area, is formed, and the area and an area including a physical size of the structure are referred to as the ESC. A size of the ESC formed by the first element M1 is related to a refractive index n1 of the first material and a wavelength λ of the incident light. As shown in FIG. 3A, an area that is about a λ/n1 distance from the first element M1 becomes the effective scattering cross-section ESC.

Referring to FIG. 3B, an effective refractive index $n_{eff}$ of the ESC may have a distribution as shown in FIG. 3B between the refractive index n1 of the first material M1 and a refractive index n2 of the second material M2. The distribution of the effective refractive index $n_{eff}$ has an effect similar to that of a graded index lens, and thus an optical path of light which is incident into locations within the distribution of the refractive index changes. In this case, a width of the ESC differs according to wavelength, and thus if the incident light includes light of various wavelengths, paths of the incident light will differ according to wavelength.

As shown in FIG. 3C, light which is incident on the e ESC passes through the ESC, with optical paths changing according to wavelength. Optical paths of light that does not pass the ESC do not change.

Color separation may be implemented by properly designing the structure and refractive index of the first material M1 and the refractive index of the second material M2.

In the image sensor 100, light of different colors is incident on the photo-sensing cells 120a, 120b, 120c and 120d forming a single unit, as shown in FIG. 4. Relative locations of the photo-sensing cells 120a, 120b, 120c and 120d correspond to first through fourth quadrants defined as a Cartesian coordinate system, as shown. Referring to FIG. 4, red light R is incident on the second photo-sensing cell 120b corresponding to the second quadrant, and blue light B is incident on the fourth photo-sensing cell 120d corresponding to the fourth quadrant. Colors represented by R+2G+B, that is, mixed-color light in which white and green light is mixed, is incident on the first photo-sensing cell 120a and the third photo-sensing cell 120c corresponding to the first quadrant and the third quadrant. A location indicated by a mark, ⓧ, means that light is incident from the first main splitters 141 or the second main splitters 142, which are disposed just above corresponding cells. That is, the red light R is incident on the second photo-sensing cell 120b from the first main splitters 141 arranged to face the second photo-sensing cell 120b, and the blue light B is incident on the fourth photo-sensing cell 120d from the second main splitters 142 arranged to face the fourth photo-sensing cell 120d. Dashed arrows indicate that light is obliquely incident. That is, since the first main splitters 141 or the second main splitters 142 are not arranged in areas of the color separation layer 180 which respectively face the first photo-sensing cell 120a and the third photo-sensing cell 120c, mixed-color light B+G or R+G is obliquely incident from the first and second main splitters 141 and 142, which are arranged to face the second and fourth photo-sensing cells 120b and 120d.

When light is incident on the image sensor 100 according to the above-described color arrangement, since primary color light is mostly used, less noise is generated when colors are restored. Also, high quality color reproduction may be achieved. Effects of the above color arrangement will be further described with reference to FIGS. 5A through 5D, 6A through 6C, and 7.

In the color arrangement of FIG. 4, light incident on the photo-sensing cells 120a, 120b, 120c and 120d, respectively, mostly has the colors as indicated color, but not 100%. Design factors of the micro lens array 190 or the first and second main splitters 141 and 142 may be adjusted, and auxiliary splitters may be additionally included to improve the efficiency of the color arrangement shown in FIG. 4.

Hereinafter, the structure of the image sensor 100 will be described in detail.

The photo sensor layer 1220 includes the first through fourth photo-sensing cells 120a, 120b, 120c and 120d which detect light and generate electrical signals. The first through fourth photo-sensing cells 120a, 120b, 120c and 120d are units for color calculation and are respectively arranged in the first to fourth quadrants. The units are repeatedly arranged in numbers as desired by a user. The first through fourth photo-sensing cells 120a, 120b, 120c and 120d operate separately and generate electrical signals having an intensity proportional to an intensity of light incident on the cells. The first through fourth photo-sensing cells 120a, 120b, 120c and 120d may each include, for example, a charge-coupled device (CCD) or a complementary metal-oxide semiconductor (CMOS). Hereinafter, in a case in which locations of the first through fourth photo-sensing cells 120a, 120b, 120c and 120d need not be specified, the first through fourth photo-sensing cells 120a, 120b, 120c and 120d will be referred to as 'pixels'.

The color separation layer 180 is arranged on an upper surface of the photo sensor layer 120. The color separation layer 180 includes the transparent spacer layer 130 and the color separation elements. The color separation elements, that is, the first and second main splitters 141 and 142, and first and second auxiliary splitters 151 and 152, are embedded and fixed in the transparent spacer layer 130 and separate the incident light according to color/wavelength based on differences between a refractive index of the transparent spacer layer 130 and that of the color separation elements. Hereinafter, any one or more of the first and second main splitters 141 and 142 and the first and second auxiliary splitters 151 and 152 may be referred to as 'the color separation elements'.

The first main splitters 141 are arranged to face the second photo-sensing cell 120b, and the second main splitters 142 are arranged to face the fourth photo-sensing cell 120d. In particular, in a first row along the line A-A' of FIG. 1, the first main splitters 141 are repeatedly arranged and face the second photo-sensing cell 120b, and in a second row along the line B-B' of FIG. 1, the second main splitters 142 are repeatedly arranged and face the fourth photo-sensing cell 120d. The first and second rows are alternately arranged.

With the arrangement of the first and second main splitters 141 and 142 as described above, the manufacturing process is easier than in a situation in which all pixels are arranged to face the color separation elements. If all the pixels were arranged to face the color separation elements, when one of the color separation elements concentrates blue light and scatters light of other colors to one or more neighboring pixels, a neighboring color separation element would need to concentrate light of a complementary color and to scatter blue light to a respectively neighboring pixel in order to achieve the color arrangement of FIG. 4. However, in such a situation, the color separation elements would need to have different heights, and the manufacturing process would necessarily be more difficult.

Cross-sections of the first main splitters 141 and the second main splitters 142 may be circular, as shown in FIG. 1, but exemplary embodiments are not limited thereto. The cross-sections of the first main splitters 141 and the second main splitters 142 may be polygonal, oval, diamond-shaped, star-shaped, sawtoothshaped, or the like. Also, a cross-sectional area of the first main splitters 141 may be larger than a cross-sectional area of the second main splitters 142, due to the size of the ESC varying according to color, as described with reference to FIGS. 3A through 3C. However, the cross-sectional areas and the differences therebetween are not limited thereto.

The first main splitters 141 and the second main splitters 142 may be arranged around a focal surface of the micro lenses 190a. The arrangement of the first main splitters 141 and the second main splitters 142 is determined in order to improve color separation efficiency. For example, the first main splitters 141 and the second main splitters 142 may be arranged on the focal surface or near the focal surface.

The first auxiliary splitters 151 surround the first main splitters 141. The first auxiliary splitters 151 are arranged to face neighboring portions of four edges of the second photo-sensing cell 120b, as shown in FIGS. 1 and 2C. Also, the second auxiliary splitters 152 surround the second main splitters 142 and are arranged to face neighboring portions of four edges of the fourth photo-sensing cell 120d.

The first and second auxiliary splitters 151 and 152 are prepared in order to improve the efficiency of incident light, making it so that light incident on the first through fourth photo-sensing cells 120a, 120b, 120c and 120d of the image sensor 100 have the desired color. The first and second auxiliary splitters 151 and 152 achieve this by color-separating light which is not incident on the ESC of the first and second main splitters 141 and 142 and/or by further color-separating light that has already been incident on and transmitted by the first and second main splitters 141 and 142. Widths of the first and second auxiliary splitters 151 and 152 may differ and are not limited to those illustrated in the drawings. Also, shapes and arrangements of the first and second auxiliary splitters 151 and 152 may vary.

Moreover, the first and second main splitters 141 and 142 and the first and second auxiliary splitters 151 and 152 surrounding them are spaced apart at regular intervals, but the first and second main splitters 141 and 142 and the first and second auxiliary splitters 151 and 152 may contact each other. In this case, the first and second main splitters 141 and 142 and the first and second auxiliary splitters 151 and 152 may be sawtooth shaped and interlock with each other.

The first and second main splitters 141 and 142 and the first and second auxiliary splitters 151 and 152 may be formed of materials having a higher refractive index than that of the transparent spacer layer 130. For example, the transparent spacer layer 130 may be formed of silicon oxide ($SiO_2$) or siloxane-based spin on glass (SOG), and the first and second main splitters 141 and 142 and the first and second auxiliary splitters 151 and 152 may be formed of materials having a high refractive index, for example, titanium dioxide ($TiO_2$), $SiN_3$, zinc sulfide (ZnS), zinc selenide (ZnSe), silicon nitride ($Si_3N_4$), or the like.

The first and second main splitters 141 and 142 and the first and second auxiliary splitters 151 and 152 may be formed of the same material. In this case, it may be easier to manufacture the color separation layer 180. That is, a first layer is formed using material of the transparent spacer layer 130 and a second layer is formed on the first layer, using the above described material for the first and second main splitters 141 and 142 and the first and second auxiliary splitters 151 and 152. Then, the color separation layer 180 may be manufactured by etching the second layer to have shapes corresponding to the shapes of the first and second main splitters 141 and 142 and the first and second auxiliary splitters 151 and 152 and spreading a material of the transparent spacer layer 130 on the etched areas of the second layer.

The micro lens array 190 is arranged on the color separation layer 180 and has a structure in which the micro lenses 190a, which concentrate the incident light, are two-dimensionally arranged. The micro lenses 190a may each have a cross-sectional area that is about twice as large as that of a photo-sensing cell and may be two-dimensionally arranged in a direction diagonal to a direction of the two-dimensional arrangement of the photo-sensing cells 120a, 120b, 120c and 120d.

The areas and the arrangement of the micro lenses 190a are determined in order to improve the efficiency of concentrating incident light onto the color separation elements. As described with reference to FIGS. 3A through 3C, the color separation is performed with regard to only that light which is incident on the ESC, and the color separation is not performed with regard to light which is not incident on the ESC. If a width of a color separation element is about 0.2 um, a width of the ESC may be about 0.6 um with respect to red light and is about half the width of pixel of about 1.12 um. That is, about 25% of the incident light is color-separated and incident on the pixels, and thus efficiency thereof is extremely decreased. Therefore, the light efficiency may be improved by using the micro lens array 190 which concentrates the incident light onto the color separation elements or the ESC of the color separation elements.

Also, as shown in FIG. 4, in order to have light of the appropriate different colors be incident on the photo-sensing cells 120a, 120b, 120c and 120d of the photo sensor layer 120 as shown in FIG. 4, the first and second main splitters 141 and 142 are not arranged in areas corresponding to the photo-sensing cells 120a, 120b, 120c and 120d, but are arranged in areas corresponding to two quadrants, which are diagonally arranged, with respect to a unit of four quadrants. Therefore, a cross-sectional area of each of the micro lenses 190a of the micro lens array 190 is twice as large as an area of a pixel so that the micro lenses 190a may concentrate the light onto two pixels.

Figure 5A:
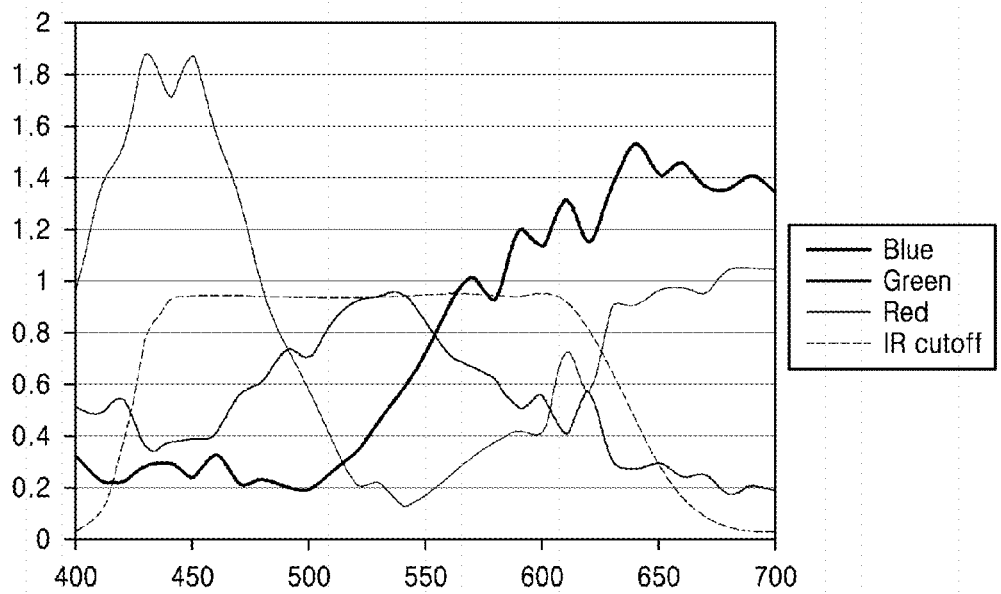
FIG. 5A is a graph of a spectrum of an image sensor according to an exemplary embodiment.
Figure 5B:
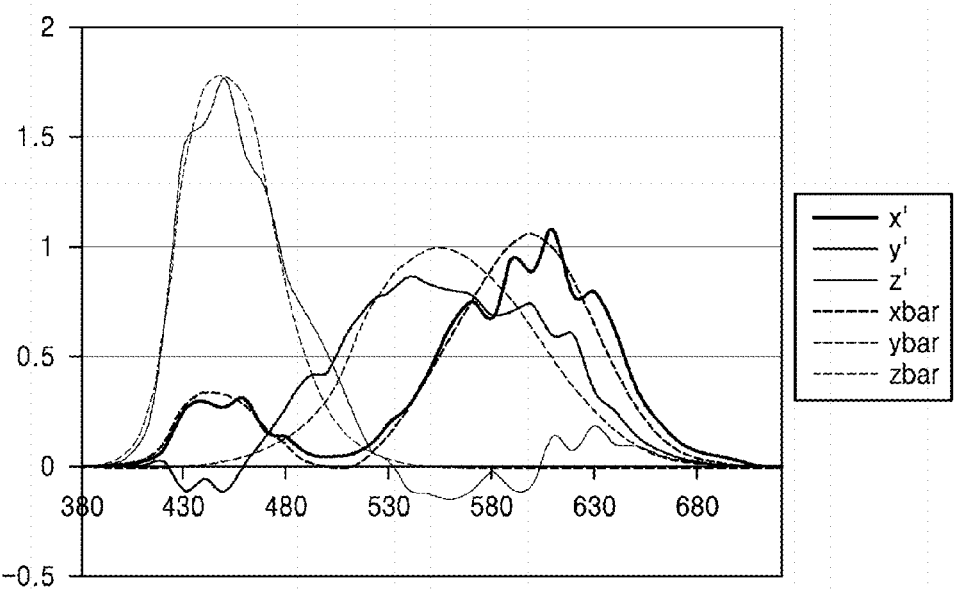
FIG. 5B is a graph of visibility curves extracted from the spectrum of FIG. 5A.

FIG. 5A is a graph of a spectrum of the image sensor 100 according to an exemplary embodiment, and FIG. 5B is a graph of visibility curves extracted from the spectrum of FIG. 5A.

The graph of FIG. 5A is translated into a visibility curve like the visibility curves of FIG. 5B through an operation referred to as color correction.

In FIG. 5B, lines x', y', and z' are visibility curves of colors embodied by the image sensor 100 according to an exemplary embodiment, and dashed lines xbar, ybar, and zbar are standard visibility curves of colors. If the two graphs are consistent with each other, it can be determined that the visibility is good.

Figure 5C:
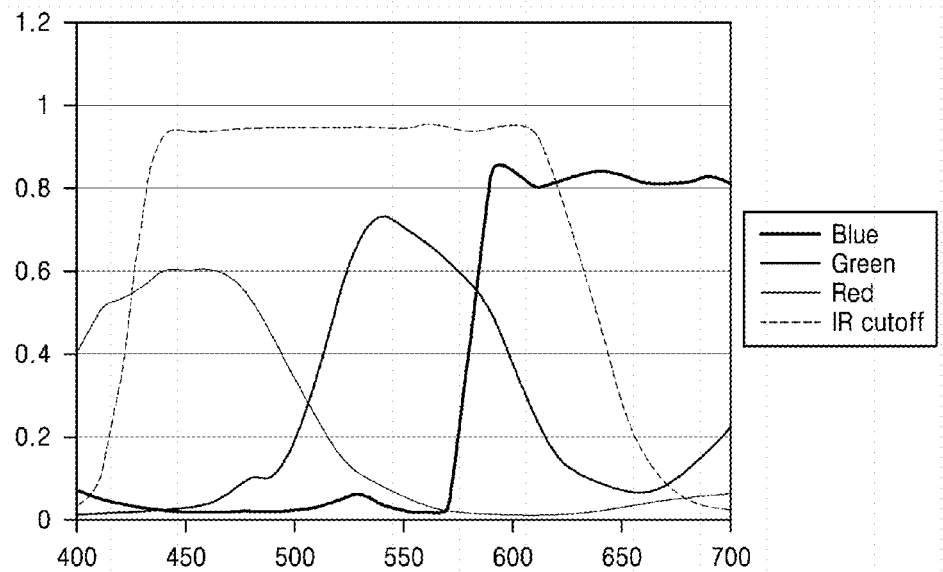
FIG. 5C is a comparative example and is a graph of a spectrum of an image sensor using color filters having a Bayer arrangement.
Figure 5D:
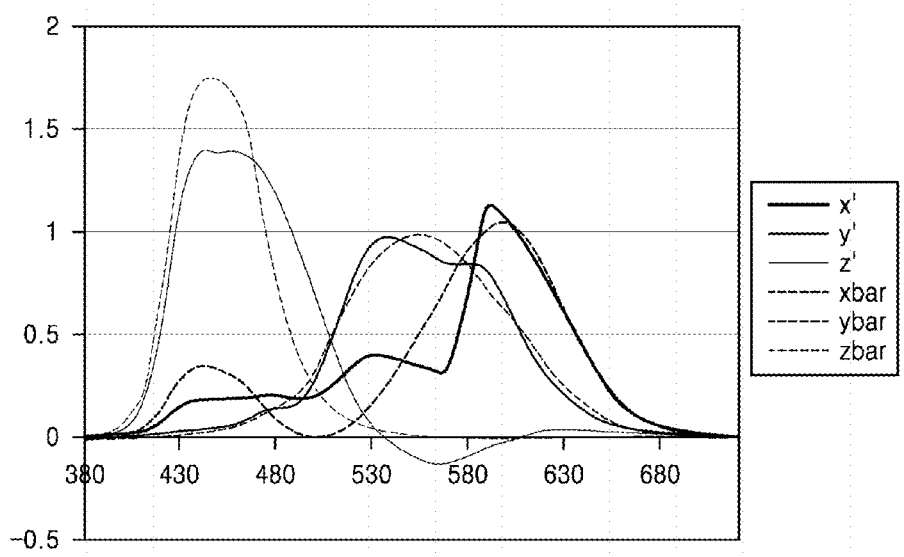
FIG. 5D is a graph of visibility curves extracted from the spectrum of FIG. 5C.

FIG. 5C is a comparative example and is a graph of a spectrum of an image sensor using color filters having a Bayer arrangement, and FIG. 5D is a graph of visibility curves extracted from the spectrum of FIG. 5C.

In FIG. 5D, lines x', y', and z' are visibility curves of colors embodied by the spectrum of FIG. 5C, and dashed lines xbar, ybar, and zbar are standard visibility curves of colors.

When FIGS. 5B and 5D are compared, the visibility curves embodied by the image sensor are highly consistent with the standard visibility curves.

Figure 6A:
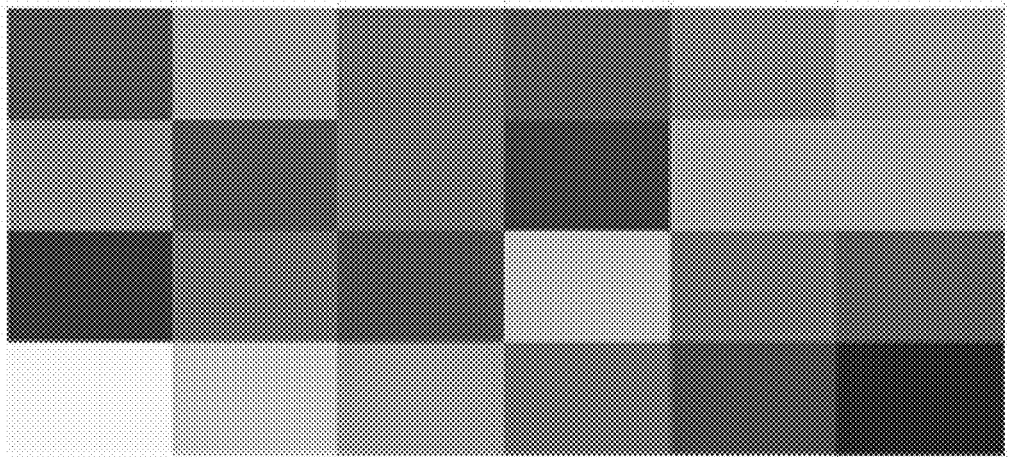
FIG. 6A is a Macbeth color chart.
Figure 6B:
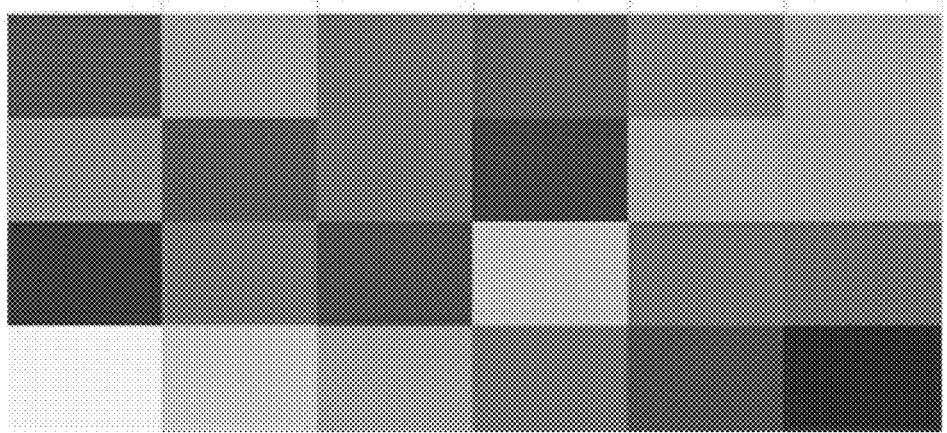
FIG. 6B is a chart of colors extracted from the visibility curves of FIG. 5B.
Figure 6C:
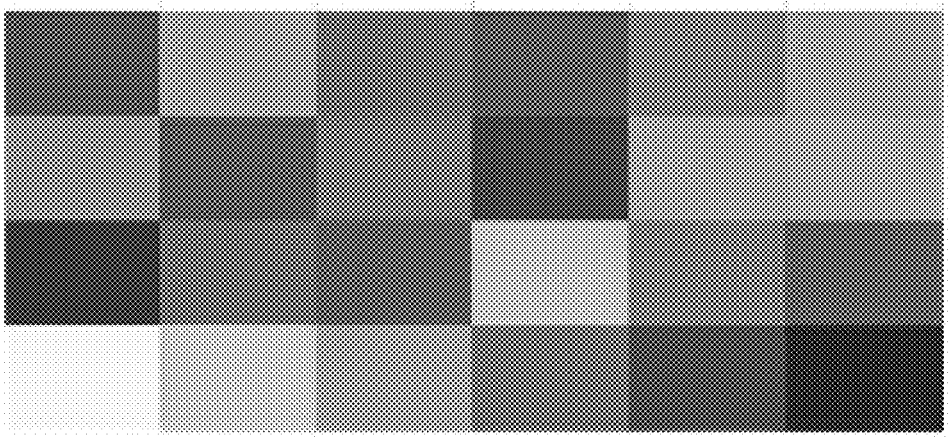
FIG. 6C is a chart of colors extracted from the visibility curves of FIG. 5D.
Figure 7:
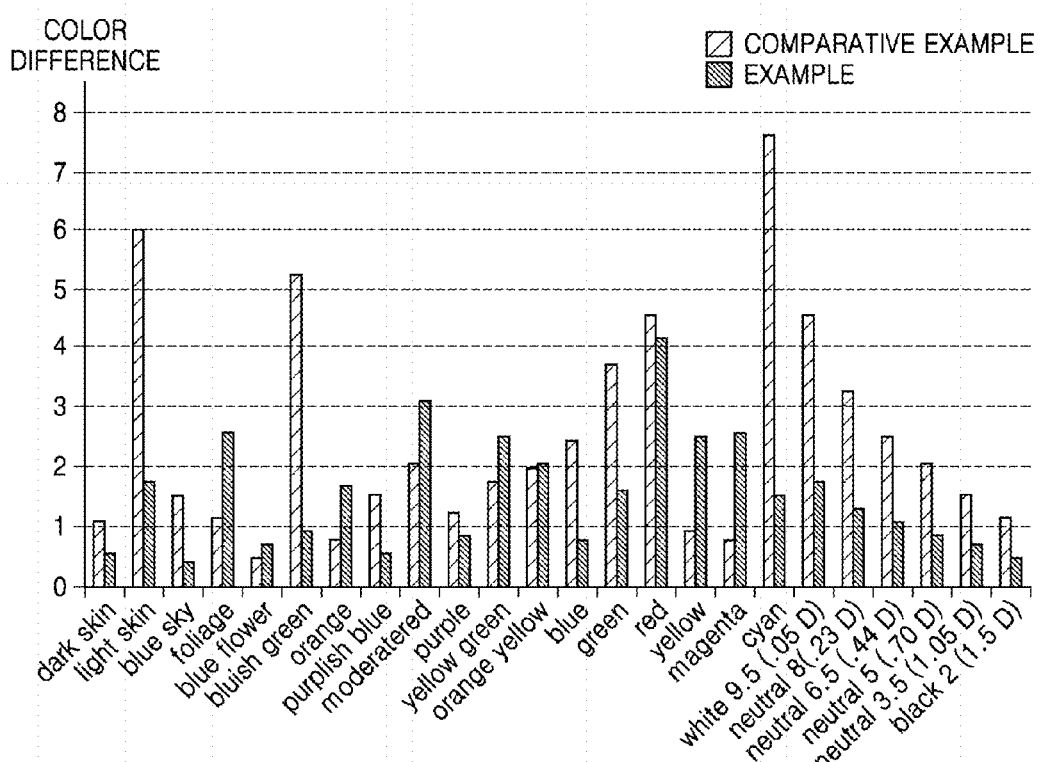
FIG. 7 is a graph showing color differences between a color chart embodied by an image sensor according to an exemplary embodiment and a color chart extracted from a color spectrum of a comparative example.

FIG. 6A is a Macbeth color chart used to examine an accuracy of the color reproduction. FIG. 6B is a chart of colors embodied by an image sensor according to an exemplary embodiment, that is, a chart of colors extracted from the visibility curves of FIG. 5B. FIG. 6C is a chart of colors extracted from the visibility curve of FIG. 5D. FIG. 7 is a graph showing color differences between a color chart embodied by an image sensor according to an exemplary embodiment and a color chart extracted from a color spectrum of a comparative example.

The color reproduction may be evaluated by directly comparing the color charts of FIGS. 6B and 6C with the Macbeth color chart of FIG. 6A. If a color difference is lower than or equal to about 3, the color difference is not recognized easily by a user's eyes, and in the case of cyan, which is arranged in a third row and sixth column, the difference between the comparative example and the Macbeth color chart, is recognized.

Referring to FIG. 7, the color difference of the exemplary embodiment is typically smaller than that of the comparative example. Furthermore, when it is considered that a color difference of about 3 or below is not recognized easily by the user's eyes, and the color difference of the exemplary embodiment is mostly about less than or equal to 3, it may be determined that the color reproduction of the exemplary embodiment is good. Also, when the exemplary embodiment is compared to the Bayer color chart of the comparative example, brightness reproduction of achromatic colors is more accurate. Reproduction of representative skin colors in a first row is improved, and thus when skin colors, which may be easily recognized by users, are reproduced, the skin colors may be exactly captured through slight color correction.

Hereinafter, detailed structures of image sensors according to one or more exemplary embodiments will be described, wherein the image sensors have high light utilization efficiency and good color reproduction.

FIGS. 8 through 11 show various examples of color separation layers 181, 182, 183 and 184 which may be employed by the image sensor of FIG. 1.

Referring to FIG. 8, the color separation layer 181 is a color separation element embedded in the transparent spacer layer 130 and includes the first main splitter 141 and first auxiliary splitters 153 surrounding the first main splitter 141 and the second main splitter 142 and second auxiliary splitters 154 surrounding the second main splitter 142. The first auxiliary splitters 153 and the second auxiliary splitters 154 each have an "L" shape.

In FIG. 9, the color separation layer 182 includes first and second auxiliary splitters 155 and 156, each having a circular shape.

In FIG. 10, the color separation layer 183 is different from the color separation layer 180 of FIG. 1 in that the arrangement of first and second auxiliary splitters 157 and 158 of the color separation layer 183 is different from that of the first and second auxiliary splitters 151 and 152. The first and second auxiliary splitters 157 and 158 are arranged around four sides of a pixel area.

Referring to FIG. 11, the color separation layer 184 includes the first auxiliary splitters 151, which are arranged around four edges of a pixel area corresponding to the first main splitter 141, and first auxiliary splitters 157 which are arranged around four sides of the pixel area. Also, the color separation layer 184 includes the second auxiliary splitters 152 which are arranged around four edges of a pixel area corresponding to the second main splitter 142, and second auxiliary splitters 158 which are arranged around four sides of the pixel area.

The image sensor 100 may employ any of the first auxiliary splitters 151, 155 and 157 and the second auxiliary splitters 152, 156 and 158 having the shapes and arrangements shown in FIGS. 8 to 11, modified shapes and/or arrangements, or combinations thereof.

Figure 12:
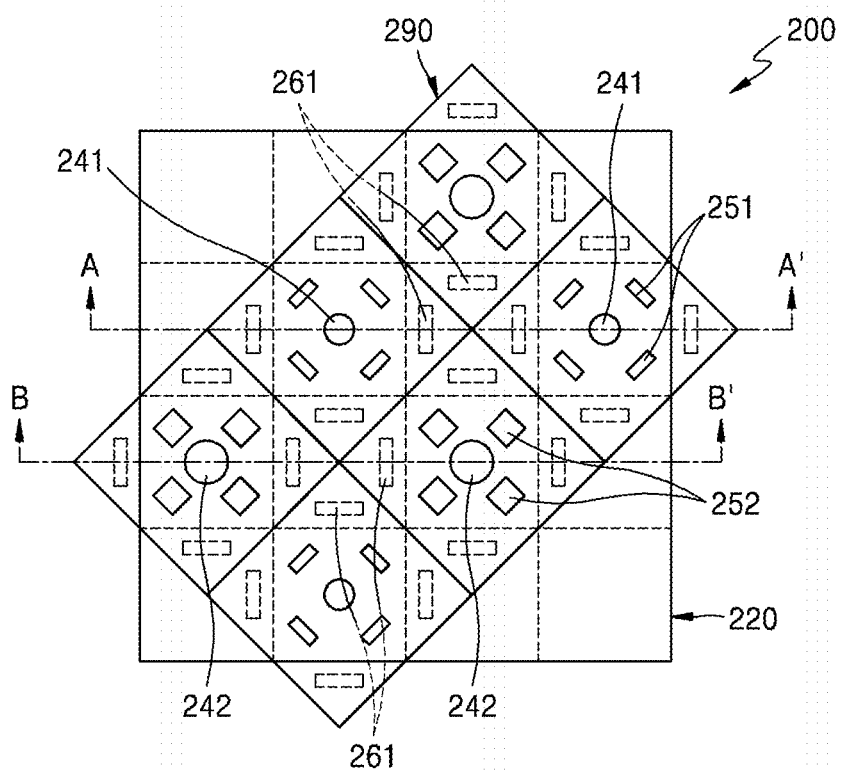
FIG. 12 is a plan view of a schematic structure of an image sensor according to another exemplary embodiment.
Figure 13A:
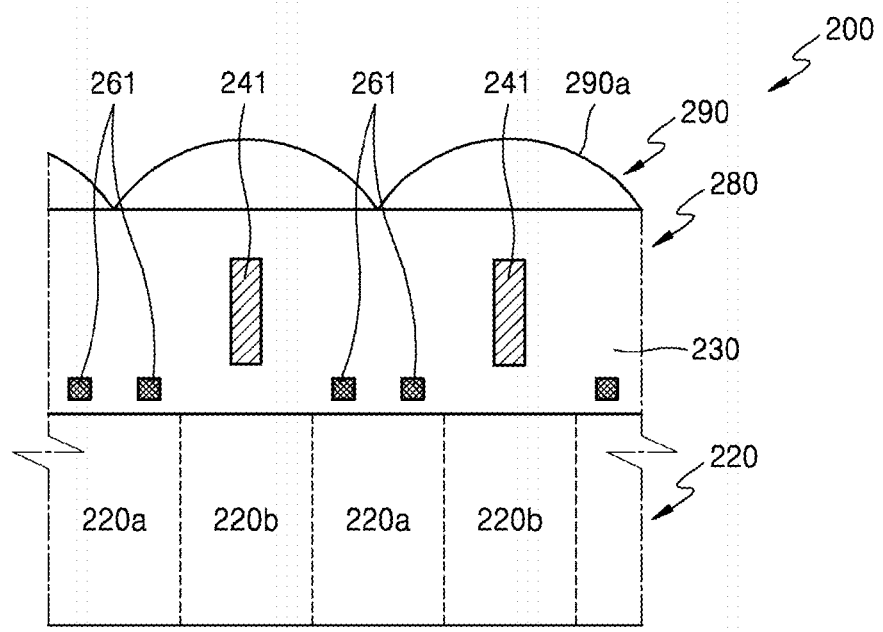
FIGS. 13A and 13B are cross-sectional views respectively taken along lines A-A' and B-B' of FIG. 12.
Figure 13B:
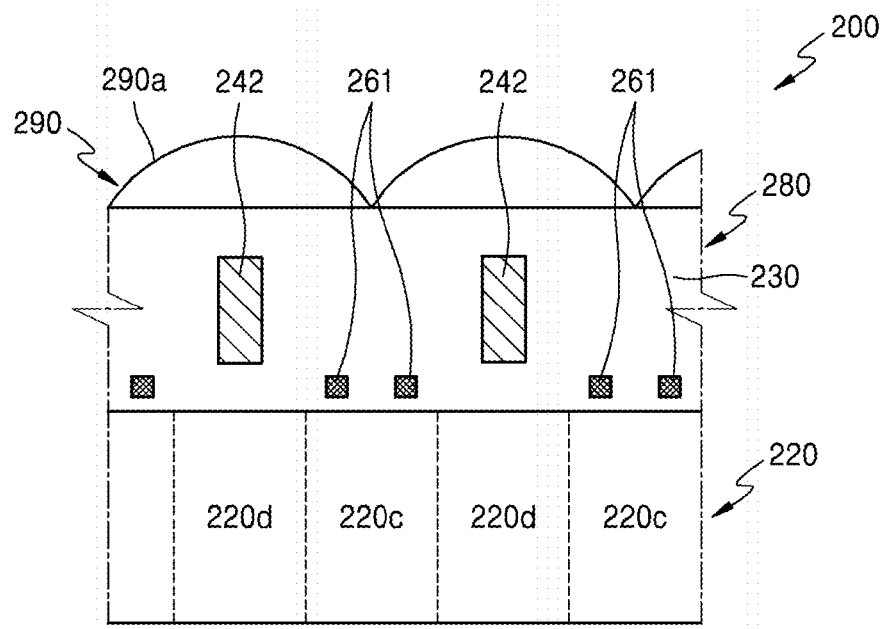

FIG. 12 is a plan view of a schematic structure of an image sensor 200 according to another exemplary embodiment, and FIGS. 13A and 13B are cross-sectional views respectively taken along lines A-A' and B-B' of FIG. 12.

The image sensor 200 includes a photo sensor layer 220, a color separation layer 280, and a micro lens array 290. The image sensor 200 is different from the image sensor 100 of FIG.1 in that the color separation layer 280 of the image sensor 200 further includes lower splitters 261. Therefore, descriptions regarding the structure of the image sensor 200, other than the color separation layer 280, are the same as the descriptions regarding the structure of the image sensor 100.

The lower splitters 261 are embedded in the transparent spacer layer 230 and are arranged in areas among the first main splitters 241, the second main splitters 242, and the photo sensor layer 220. In particular, the lower splitters 261 are arranged in areas between surfaces defined by lowermost surfaces of the first main splitters 241 and those of the second main splitters 242 and the photo sensor layer 220.

As shown in FIG. 13A, the lower splitters 261 are each arranged in a location facing a first photo-sensing cell 220a, and as shown in FIG. 13B, the lower splitters 261 are each arranged in a location facing a third photo-sensing cell 220c.

Like the first and second auxiliary splitters 251 and 252, the lower splitters 261 are used to separate light that has not been incident on the ESC of the first and second main splitters 241 and 242 and/or further separate light that has been transmitted by the ESC. In addition, the light separated by the first and second auxiliary splitters 251 and 252 may be further separated by the lower splitters 261.

Four lower splitters 261 are arranged on each area corresponding to the first photo-sensing cell 220a and the third photo-sensing cell 220c and around four sides of each pixel, but the present exemplary embodiment is not limited thereto.

Figure 14:
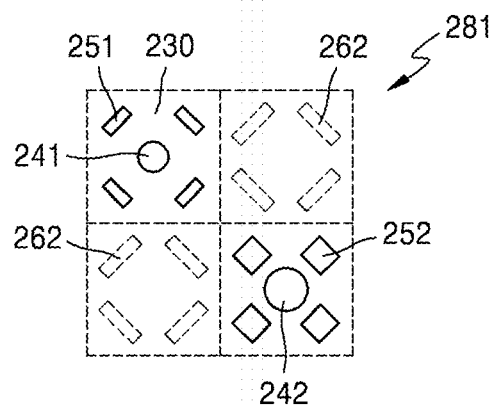
FIGS. 14 and 15 show various examples of color separation layers which may be employed by the image sensor of FIG. 12.
Figure 15:
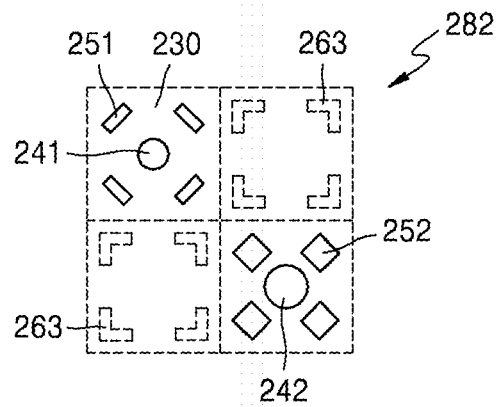

FIGS. 14 and 15 show various examples of color separation layers 281 and 282 which may be employed by the image sensor 200 of FIG. 12.

In the color separation layer 281 of FIG. 14, the lower splitters 262 are each arranged in a location corresponding to four edges of a pixel facing the lower splitters 262.

Cross-sections of lower splitters 263 of the color separation layer 282 of FIG. 15 each have an "L" shape.

The lower splitters 262 and 263 having a modified shape or mixed shape may be employed by the image sensor 200. Also, the shapes of the first and second auxiliary splitters 241 and 242 are illustrated as the shapes shown in FIG. 1, but first and second auxiliary splitters 251 and 252 having any of various shapes may be employed in the image sensor 200.

Figure 16:
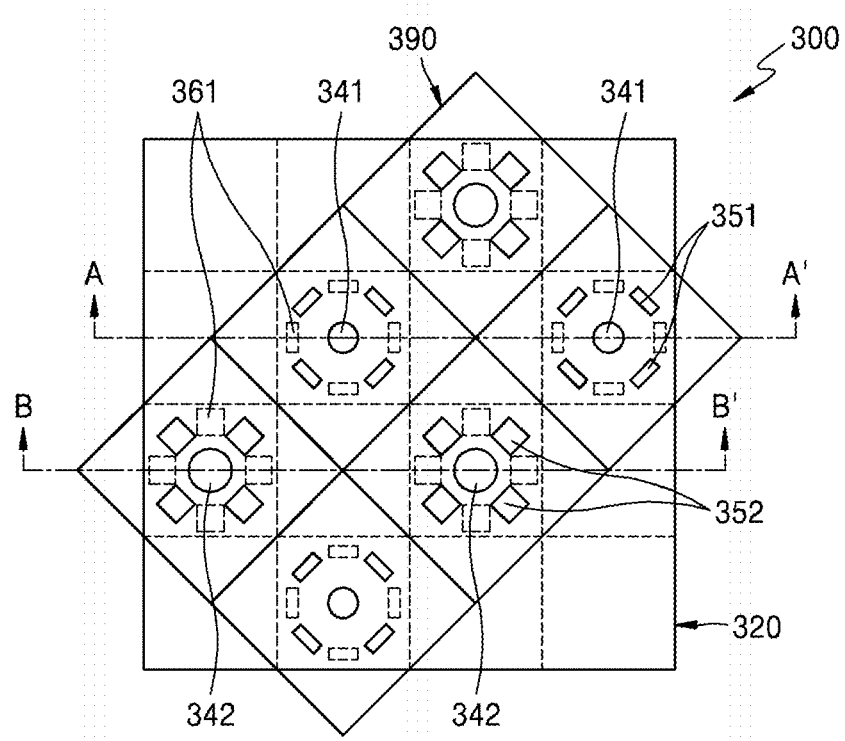
FIG. 16 is a plan view of a schematic structure of an image sensor according to another exemplary embodiment.
Figure 17A:
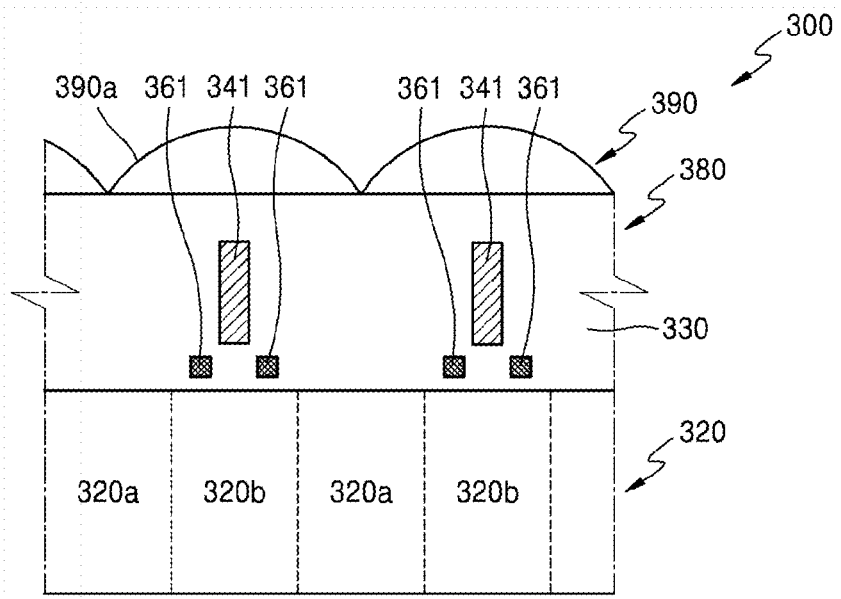
FIGS. 17A and 17B are cross-sectional views respectively taken along lines A-A' and B-B' of FIG. 16.
Figure 17B:
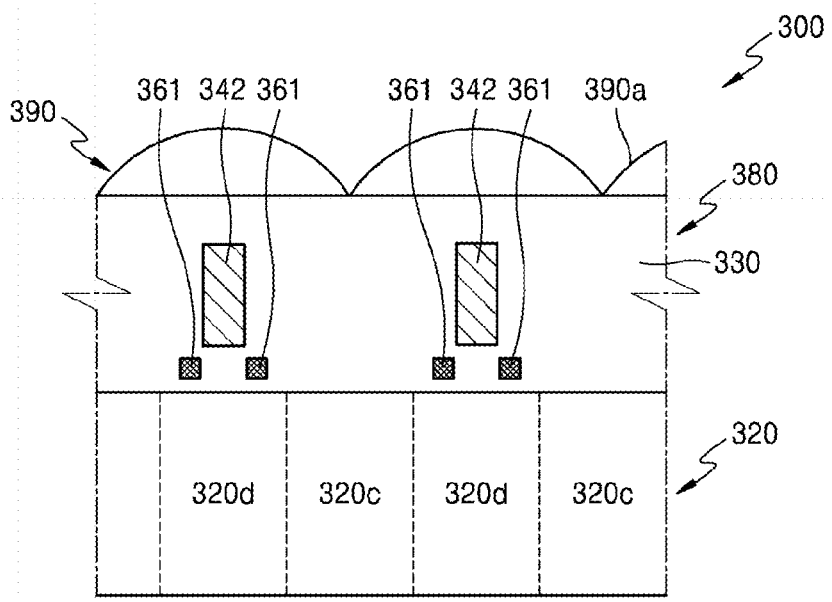

FIG. 16 is a plan view of a schematic structure of an image sensor 300 according to another exemplary embodiment, and FIGS. 17A and 17B are cross-sectional views respectively taken along lines A-A' and B-B' of FIG. 16.

The image sensor 300 is different from the image sensor 200 of FIG. 12 in that the arrangement of lower splitters 361 is different from that of the lower splitters 262. Descriptions regarding other components are the same as descriptions regarding the components of FIG. 1.

As shown in FIG. 17A, the lower splitters 361 may each be arranged at a location facing a second photo-sensing cell 320b, and as shown in FIG. 17B, the lower splitters 361 may each be arranged at a location facing a fourth photo-sensing cell 320d.

Figure 18:
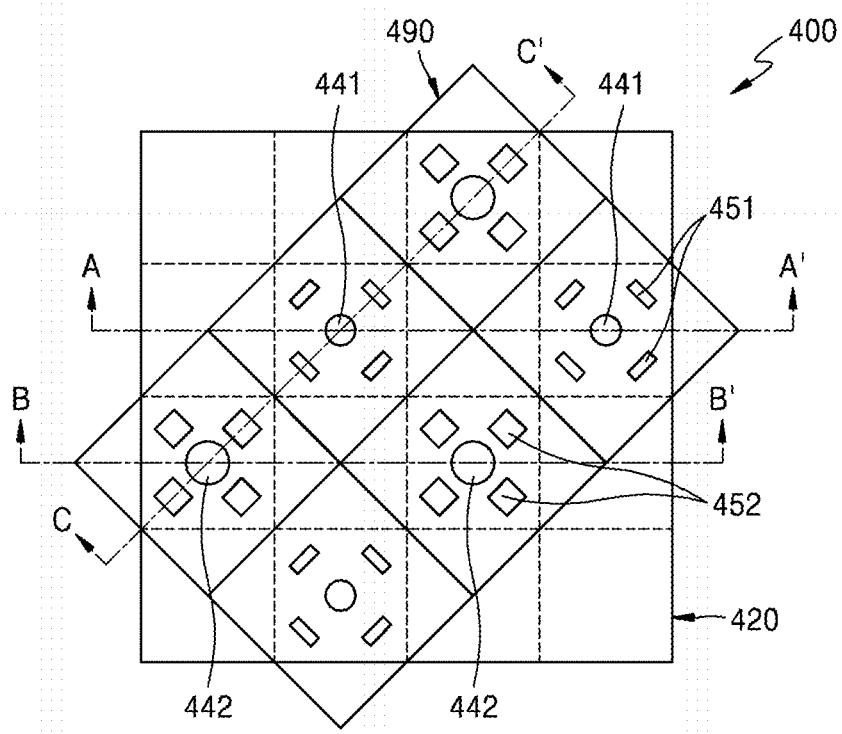
FIG. 18 is a plan view of a schematic structure of an image sensor according to another exemplary embodiment.
Figure 19A:
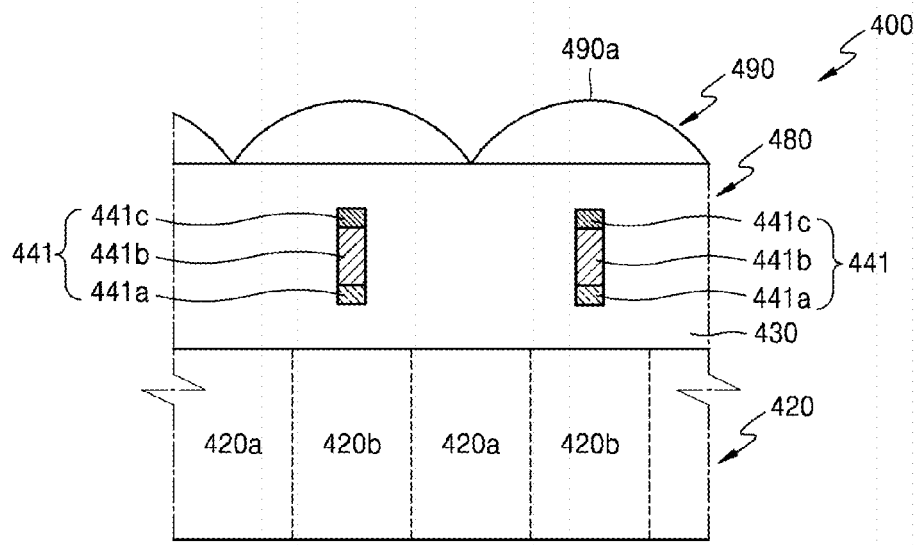
FIGS. 19A through 19C are cross-sectional views respectively taken along lines A-A', B-B', and C-C' of FIG. 18.
Figure 19B:
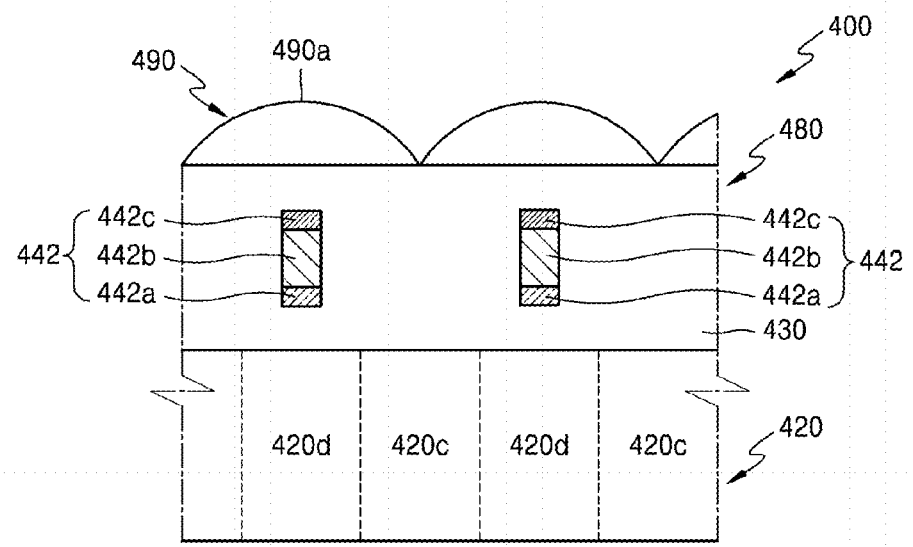

FIG. 18 is a plan view of a schematic structure of an image sensor 400 according to another exemplary embodiment, and FIGS. 19A and 19B are cross-sectional views respectively taken along lines A-A', B-B', and C-C' of FIG. 18.

The image sensor 400 is different from the image sensor 100 of FIG. 1 in that the first and second main splitters 441 and 442, and the first and second auxiliary splitters 451 and 452 are formed of multiple layers. Descriptions regarding components of the image sensor 400, other than the first and second main splitters 441 and 442, and the first and second auxiliary splitters 451 and 452, are the same as the descriptions regarding the components of the image sensor 100.

The first main splitters 441 include a first main layer 441a and a second main layer 441b formed on the first main layer 441a. Also, a third main layer 441c may be further formed on the second main layer 441b. The first main layer 441a and the third main layer 441c are formed of materials having lower refractive indices than a refractive index of the second main layer 441b but having greater refractive indices than a refractive index of a transparent spacer layer 430.

The second main splitters 442 include a first main layer 442a and a second main layer 442b formed on the first main layer 442a. A third main layer 442c may be further formed on the second main layer 442b. The first main layer 442a and the third main layer 442c are formed of materials having lower refractive indices than a refractive index of the second main layer 442b but having greater refractive indices than the refractive index of the transparent spacer layer 430.

The above-described structure is formed for color separation efficiency. Light which is concentrated by the micro lens array 490 and is incident on the first and second main splitters 441 and 442 is not only vertically incident, and some of the light may be obliquely incident around sides of the first and second main splitters 441 and 442. Also, a direction of the light which is separated and emitted from the first and second main splitters 441 and 442 may be not only a direction vertical to a light-emitting surface but also a direction oblique to the sides of the first and second main splitters 441 and 442. In this case, when a difference between the refractive indices of the transparent spacer layer 430 and the first and second main splitters 441 and 442 is large, light, which may not be incident on pixels of the color sensor layer 420 due to total reflection of the light, may be generated. Because of the structures of the first and second main splitters 441 and 442 of the present exemplary embodiment, the difference between the refractive indices of the transparent spacer layer 430 and the first and second main splitters 441 and 442 may be decreased, and the efficiency of light which is incident from the color separation elements to the pixels may be improved.

The first auxiliary splitter 451 and the second auxiliary splitter 452 may have similar structures to the first main splitters 441 and the second main splitters 442. That is, the first auxiliary splitter 451 may include a first auxiliary layer 451a and a second auxiliary layer 451b formed on the first auxiliary layer 451a and may further include a third auxiliary layer 451c formed on the second auxiliary layer 451b. Refractive indices of the first auxiliary layer 451a and the third auxiliary layer 451c are smaller than a refractive index of the second auxiliary layer 451b but may be greater than the refractive index of the transparent spacer layer 430

The second auxiliary splitter 452 may include a first auxiliary layer 452a, a second auxiliary layer 452b, and a third auxiliary layer 452c.

The first auxiliary layers 451a and 452a and the first main layers 441a and 442a may be formed of the same material, for example, a first material, and the second auxiliary layers 451b and 452b and the second main layers 441b and 442b may be formed of the same material, for example, a second material. The third auxiliary layers 451c and 452c and the third main layers 441c and 442c may be formed of the same material, for example, a third material.

If the first auxiliary layers 451a and 452a, the first main layers 441a and 442a, the second auxiliary layers 451b and 452b, the second main layers 441b and 442b, the third auxiliary layers 451c and 452c, and the third main layers 441c and 442c are formed as described above, a color separation layer 480 may be easily formed. That is, the color separation layer 480 may be manufactured by sequentially stacking the first material, the second material, and the third material, etching the first, second, and third materials to have shapes corresponding to the first and second main splitters 441 and 442 and the first and second auxiliary splitters 451 and 452, and filling the etched areas and an upper surface of the color separation layer 480 with a material forming a transparent spacer layer.

Figure 19C:
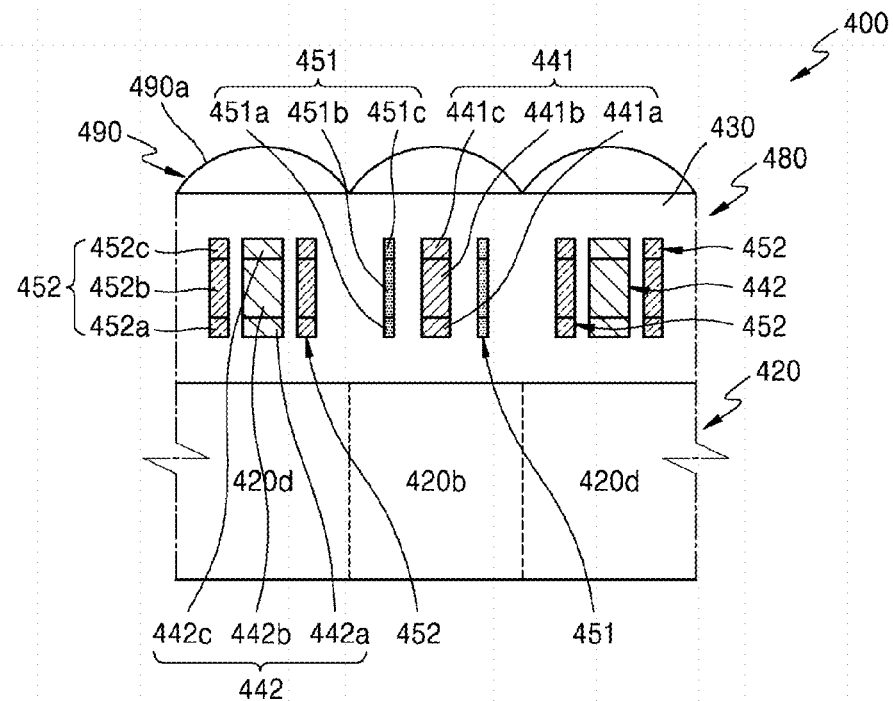

In FIGS. 19A to 19C, the first and second main splitters 441 and 442, and the first and second auxiliary splitters 451 and 452 have a trilayer structure, but some or all of the first and second main splitters 441 and 442, and the first and second auxiliary splitters 451 and 452 may have a double-layer structure.

Figure 20A:
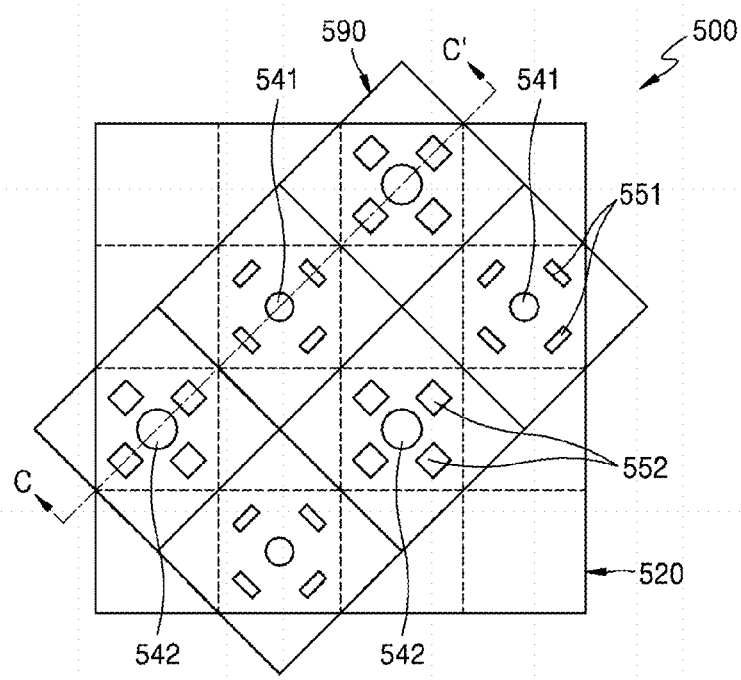
FIG. 20A is a plan view of a schematic structure of an image sensor according to another exemplary embodiment.
Figure 20B:
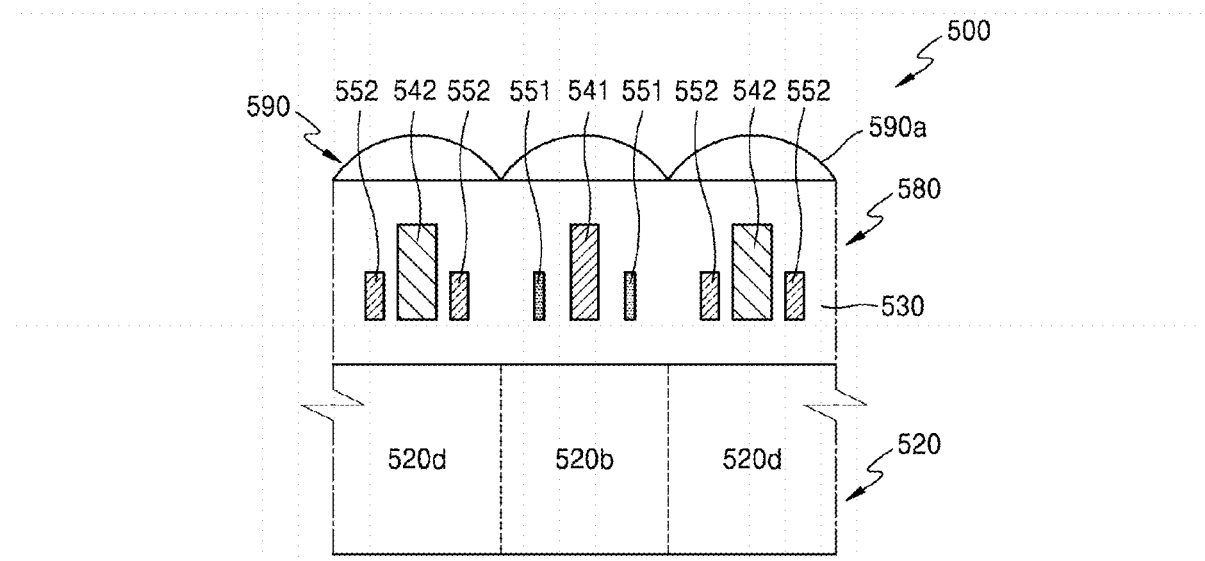
FIG. 20B is a cross-sectional view taken along a line C-C' of FIG. 20A.

FIG. 20A is a plan view of a schematic structure of an image sensor 500 according to another exemplary embodiment, and FIG. 20B is a cross-sectional view taken along a line C-C' of FIG. 20A.

The image sensor 500 is different from the image sensor 100 of FIG. 1 in that heights of first and second auxiliary splitters 551 and 552 are different from those of first and second main splitters 541 and 542. Descriptions regarding components of the image sensor 500, other than the first and second auxiliary splitters 551 and 552 and the first and second main splitters 541 and 542, are the same as the descriptions regarding the components of the image sensor 100.

Referring to FIG. 20B, lowermost surfaces of the first and second main splitters 541 and 542 may be on the same level as those of the first and second auxiliary splitters 551 and 552.

As described above, the first and second auxiliary splitters 551 and 552 support the first and second main splitters 541 and 542. Also, since incident light is intensively incident on upper surfaces of the first and second main splitters 541 and 542 due to the presence of the micro lens array 590, the utility of the first and second auxiliary splitters 551 and 552 around the upper surfaces of the first and second main splitters 541 and 542 may be insignificant. In consideration of this, the heights of the first and second auxiliary splitters 551 and 552 may be lower than those of the first and second main splitters 541 and 542.

Figure 21:
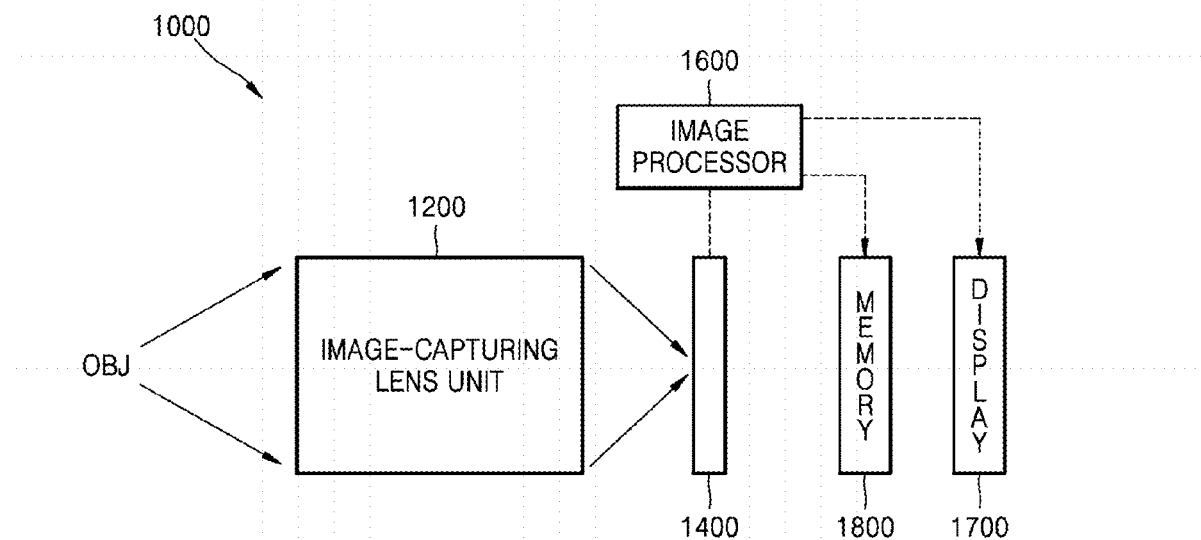
FIG. 21 is a block diagram of a schematic structure of an imaging device according to an exemplary embodiment.

FIG. 21 is a plan view of a schematic structure of an image sensor 1000 according to another exemplary embodiment.

The imaging device 1000 includes an image-capturing lens unit 1200 which forms an optical image by concentrating light reflected from an object OBJ and an image sensor 1400 which converts the optical image formed by the image-capturing lens unit 1200 into electrical signals. An infrared cutoff filter may be further arranged between the image sensor 1400 and the image-capturing lens unit 1200.

The image sensor 1400 may be an image sensor which corresponds to any one of the image sensors 100, 200, 300, 400 and 500 or a combination in which features of the image sensors 100, 200, 300, 400 and 500 are selectively combined.

The imaging device 1000 includes an image processor 1600 which translates the electrical signals transmitted from the image sensor 1400 into image signals. The image processor 1600 forms an image by performing operations such as noise removal and color interpolation with regard to signals of each color which is sensed by the image sensor 1400. The imaging device 1000 may further include a display 1700 which displays the image formed by the image processor 1600 and a memory 1800 which stores image data formed by the image processor 1600.

As described above, in the image sensor 1400, color separation of incident light is performed so that two pixels, out of four pixels which form a unit, sense primary color light such as red light and blue light, and the other two pixels of the unit of four pixels sense mixed-color light in which green light and white light are mixed. Therefore, noise amplification caused by color calculation is low in the image processor 1600. Also, the image sensor 1400 achieves high quality color reproduction, and thus, additional color correction may be reduced in the image processor 1600.

The image sensors described above obtains color images without using color filters, and thus light utilization efficiency thereof is high. Therefore, a signal-to-noise ratio may be lower than that of a conventional image sensor at the same intensity of illumination, and although widths of pixels are decreased, the signal-to-noise ratio is not increased.

An image sensor according to one or more of the exemplary embodiments described above may have low noise amplification during color operations, and thus definition may be improved and high quality color reproduction may be achieved.

An image sensor according to one or more of the exemplary embodiments described above may be employed by an imaging device and may form high-quality images.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments of the present inventive concept have been described with reference to the figures, it will be understood by those of ordinary skill in the art that various changes in form and details may be made therein without departing from the spirit and scope of the present inventive concept as defined by the following claims.

What is claimed is:
1. An image sensor comprising:
a photo sensor layer comprising a two-dimensional array of a plurality of photo-sensing cells, the plurality of photo-sensing cells comprising a first photo-sensing cell, a second photo-sensing cell, a third photo-sensing cell, and a fourth photo-sensing cell, which respectively correspond to a first quadrant, a second quadrant, a third quadrant, and a fourth quadrant defined in a Cartesian coordinate system;
a color separation layer disposed on the photo sensor layer, the color separation layer comprising a transparent spacer layer and color separation elements disposed within the transparent spacer layer, wherein the color separation layer separates light incident thereon according to wavelength; and
a micro lens array disposed on the color separation layer, the micro lens array comprising a two-dimensional array of a plurality of micro lenses, wherein each of the plurality of micro lenses concentrates light incident thereon onto one of the plurality of color separation elements, wherein the plurality of color separation elements comprises:
  a first main splitter which transmits light of a first primary color, without diffraction or refraction, onto the second photo-sensing cell and which diffracts and/or refracts light of mixed colors, other than the first primary color, onto photo-sensing cells adjacent to the second photo-sensing cell;
  a plurality of first auxiliary splitters which are arranged around the first main splitter and separate light incident thereon according to color;
  a second main splitter which transmits light of a second primary color, different from the first primary color, without diffraction or refraction, onto a fourth photo-sensing cell and which diffracts and/or refracts light of mixed colors, other than the second primary color, onto photo-sensing cells adjacent to the fourth photo-sensing cell; and
  a plurality of second auxiliary splitters which are arranged around the second main splitter and separate light incident thereon according to color;

wherein the first main splitter and the plurality of first auxiliary splitters are arranged in an area facing the second photo-sensing cell, and
the second main splitter and the plurality of second auxiliary splitters are arranged in an area facing the fourth photo-sensing cell.

2. The image sensor of claim 1, wherein a cross-sectional area of each of the plurality of micro lenses is twice as large as a cross-sectional area of each of the plurality of photo-sensing cells, and
the plurality of micro lenses are two-dimensionally arranged in rows and columns which are diagonal with respect to rows and columns in which the plurality of photo-sensing cells are two-dimensionally arranged.

3. The image sensor of claim 1, wherein a refractive index of each of the plurality of color separation elements is greater than a refractive index of the transparent spacer layer.

4. The image sensor of claim 1, wherein the first main splitter, the second main splitter, the plurality of first auxiliary splitters, and the plurality of second auxiliary splitters are formed so that red light is incident on the second photo-sensing cell, blue light is incident on the fourth photo-sensing cell, and mixed-color light, including white light and green light, is incident on the first photo-sensing cell and the third photo-sensing cell.

5. The image sensor of claim 1, wherein the plurality of first auxiliary splitters are arranged in areas facing four edges of the second photo-sensing cell, and
the plurality of second auxiliary splitters are arranged in areas facing four edges of the fourth photo-sensing cell.

6. The image sensor of claim 5, further comprising:
a plurality of third auxiliary splitters which are arranged in areas facing areas adjacent to centers of the four edges of the second photo-sensing cell, and
a plurality of fourth auxiliary splitters which are arranged in areas facing areas adjacent to centers of the four edges of the fourth photo-sensing cell.

7. The image sensor of claim 1, wherein the plurality of first auxiliary splitters are arranged in areas facing areas adjacent to centers of the four edges of the second photo-sensing cell, and
the plurality of second auxiliary splitters are arranged in areas facing areas adjacent to centers of the four edges of the fourth photo-sensing cell.

8. The image sensor of claim 1, further comprising a plurality of lower splitters arranged in areas disposed between a surface defined by lowermost surfaces of the first main splitter and the second main splitter and the photo sensor layer.

9. The image sensor of claim 8, wherein the plurality of lower splitters are arranged in areas which face the first photo-sensing cell and the third photo-sensing cell.

10. The image sensor of claim 8, wherein the plurality of lower splitters are arranged in areas which face the second photo-sensing cell and the fourth photo-sensing cell.

11. The image sensor of claim 1, wherein each of the first main splitter and the second main splitter comprise a first main layer and a second main layer arranged on the first main layer, and
a refractive index of the first main layer is smaller than a refractive index of the second main layer, and the refractive index of the first main layer is greater than a refractive index of the transparent spacer layer.

12. The image sensor of claim 11, wherein each of the plurality of first auxiliary splitters and the plurality of second auxiliary splitters comprise a first auxiliary layer and a second auxiliary layer arranged on the first auxiliary layer, and
a refractive index of the first auxiliary layer is smaller than a refractive index of the second auxiliary layer, and the refractive index of the first auxiliary layer is greater than the refractive index of the transparent spacer layer.

13. The image sensor of claim 11, wherein each of the first main splitter and the second main splitter further comprise a third main layer arranged on the second main layer, and
a refractive index of the third main layer is smaller than the refractive index of the second main layer, and the refractive index of the third main layer is greater than the refractive index of the transparent spacer layer.

14. The image sensor of claim 13, wherein each of the plurality of first auxiliary splitters and the plurality of second auxiliary splitters further comprise a third auxiliary layer arranged on the second auxiliary layer, and
a refractive index of the third auxiliary layer is smaller than the refractive index of the second auxiliary layer, and the refractive index of the third auxiliary layer is greater than the refractive index of the transparent spacer layer.

15. The image sensor of claim 1, wherein the plurality of first auxiliary splitters and the plurality of second auxiliary splitters are formed at different heights than heights at which the first main splitter and the second main splitter are formed.

16. The image sensor of claim 15, wherein a lowermost surface of the first main splitter and a lowermost surface of the second main splitter are on a same level as lowermost surfaces of the plurality of first auxiliary splitters and lowermost surfaces of the plurality of second auxiliary splitters.

17. An imaging device comprising:
an image-capturing lens unit which concentrates light incident thereon and thereby forms an optical image; and
the image sensor of claim 1.

* * * * *